United States Patent
Abdellaoui et al.

(10) Patent No.: US 7,218,898 B2
(45) Date of Patent: May 15, 2007

(54) APPARATUS AND METHOD FOR FREQUENCY GENERATION IN MOBILE COMMUNICATION SYSTEM

(75) Inventors: Mohsen Abdellaoui, San Diego, CA (US); Yong-suk Kim, Daejeon (KR); Wan-jin Kim, Seoul (KR); Dan Meacham, San Diego, CA (US); Woo-Kyung Lee, Suwon-si (KR)

(73) Assignees: Samsung Electronics Co., Ltd., Gyeonggi-do (KR); Staccato Communications, Inc., San Diego, CA (US)

( * ) Notice: Subject to any disclaimer, the term of this patent is extended or adjusted under 35 U.S.C. 154(b) by 399 days.

(21) Appl. No.: 10/889,056

(22) Filed: Jul. 13, 2004

(65) Prior Publication Data

US 2005/0014479 A1    Jan. 20, 2005

Related U.S. Application Data

(60) Provisional application No. 60/486,416, filed on Jul. 14, 2003.

(30) Foreign Application Priority Data

Mar. 30, 2004    (KR) ...................... 10-2004-0021466

(51) Int. Cl.
H04B 1/04    (2006.01)
H03C 3/00    (2006.01)
H03C 1/52    (2006.01)

(52) U.S. Cl. ...................... 455/109; 455/103; 455/110; 375/301; 375/270

(58) Field of Classification Search ................ 455/109, 455/103, 104, 110, 203, 204; 375/301, 270
See application file for complete search history.

(56) References Cited

U.S. PATENT DOCUMENTS

| | | | |
|---|---|---|---|
| 4,955,083 A | | 9/1990 | Phillips et al. |
| 5,220,557 A | * | 6/1993 | Kelley .................. 370/345 |
| 5,506,548 A | * | 4/1996 | Kajimoto et al. .......... 332/170 |
| 6,496,545 B1 | * | 12/2002 | Liu ................ 375/301 |
| 6,519,279 B1 | | 2/2003 | Abdesselem et al. |

(Continued)

FOREIGN PATENT DOCUMENTS

EP    0 801 465 A1    10/1997

(Continued)

OTHER PUBLICATIONS

Shor et al, "TG3a-Wisar Contribution on Multi-band Implementation", IEEE 802.15 Working Group for Wireless Personal Area Network, May 5, 2003, Doc IEEE 802.15-03/207r0, 16 pages.*

*Primary Examiner*—Duc M. Nguyen
(74) *Attorney, Agent, or Firm*—Sughrue Mion, PLLC

(57) ABSTRACT

An apparatus and method for generating an intermediate frequency (IF) to be transferred to a single sideband (SSB) generator which generates carriers using one local oscillator (LO) signal and at least two IF signals that are received. A group signal is generated which includes a non-phase-shifted signal and a phase-shifted signal to a predetermined value with respect to each IF. One of the group signals is selected and transferred to the SSB generator. Accordingly, the SSB generator performs the phase shift on the LO signal alone.

14 Claims, 4 Drawing Sheets

U.S. PATENT DOCUMENTS

2004/0131130 A1*   7/2004   Shor et al. .................. 375/308
2006/0063490 A1*   3/2006   Bader et al. .................. 455/45

FOREIGN PATENT DOCUMENTS

| JP | 11097935   | 4/1999 |
| JP | 2000269832 | 9/2000 |
| JP | 2002526958 | 8/2002 |
| JP | 2003023365 | 1/2003 |
| JP | 2003133970 | 5/2003 |

* cited by examiner

APPARATUS AND METHOD FOR FREQUENCY GENERATION IN MOBILE COMMUNICATION SYSTEM

CROSS-REFERENCE TO RELATED APPLICATIONS

This application claims the benefit of U.S. Provisional Application No. 60/486,416, filed on Jul. 14, 2003 in the United States Patent and Trademark Office, and Korean Patent Application No. 2004-21466, filed Mar. 30, 2004, in the Korean Intellectual Property Office, the disclosures of which are incorporated herein by reference in their entireties.

BACKGROUND OF THE INVENTION

1. Field of the Invention

Systems, apparatuses, and methods consistent with the present invention generally relate to a communication system using a wide band, and more specifically, to an apparatus and a method for generating a radio signal used in a wide-band communication.

2. Description of the Related Art

In general, a communication system transmits data to a reception side using a carrier frequency, which requires the generation of the carrier frequency. A local oscillator (LO) is utilized to generate a frequency for data transmission. The data is transmitted using a signal generated by the LO, or, a predetermined procedure is firstly performed when the signal generated by the LO is not a desired signal. The desired signal is generated by performing the predetermined procedure with respect to the signal generated by the LO using a specific signal. Hereinafter, a LO signal denotes the signal generated by the LO.

In a wireless system applying quadrature phase shifting keying (QPSK), a mixer mixes the LO signal and intermediate frequency (IF) signals having a phase difference of 90° with respect to the LO signal so as to generate two signals having 90° phase difference at the same time. In general, a single mixer mixes the LO signal and the IF signal to simultaneously output two signals. Specifically, based on the frequency of the LO signal, one signal having a frequency higher than that of the IF signal and the other signal having a frequency lower than that of the IF signal are output. A filter is used to select one of the two output signals. An undesired frequency is removed generally using a band-pass filter to pass only the desired frequency.

However, as the frequency becomes higher, it is harder to implement a narrow-band filter. It is preferred not to use the narrow-band filter since the implementation of the narrow-band filter is hard on an integrated circuit. To overcome these shortcomings, a single sideband (SSB) system is used to selectively generate one desired signal alone. The SSB system is described in detail below.

By Fourier-transforming and frequency-analyzing a signal of which amplitude is modulated, the signal is shifted to frequencies above and below the carrier frequency (IF), to thus generate an upper sideband (USB) and a lower sideband (LSB) carrying the same information. A double sideband (DSB) transmission transmits both of the USB and the LSB, and the SSB transmission transmits only one sideband by removing unnecessary sidebands. Since audio or music does not have signal components in low frequency band, the SSB transmission alone is enough to communicate. Since the signal is transmitted to the reception side in one of the USB and the LSB, the scale of the reception side is reduced and the power consumption is lowered.

FIG. 1 illustrates a conventional SSB generator, which is described below. The SSB generator includes two mixers 102 and 106 and an operator 108.

The respective mixers 102 and 106 mix the input IF signal and LO signal. The mixed signals are furnished to the operator 108. The operator 108 performs an addition operation or a subtraction operation on the signals. The SSB generator outputs only one signal based on the following Equations.

Let the IF signal input to the mixer 102 be $\cos(w_{IF}t)$ and let the LO signal be $\cos(w_{LO}t)$. The mixer 102 outputs $\cos(w_{IF}t)\cos(w_{LO}t)$ by mixing the received signals based on Equation 1. Let the IF signal input to the mixer 106 be $\sin(w_{IF}t)$ and let the LO signal be $\sin(w_{LO}t)$. The mixer 106 outputs $\sin(w_{IF}t)\sin(w_{LO}t)$ by mixing the received signals based on Equation 2.

$$\cos(w_{LO}t)\cos(w_{IF}t) = \frac{1}{2}[\cos((w_{LO}+w_{IF})t) + \cos((w_{LO}-w_{IF})t)] \quad \text{[Equation 1]}$$

$$\sin(w_{LO}t)\sin(w_{IF}t) = \frac{1}{2}[-\cos((w_{LO}+w_{IF})t) + \cos((w_{LO}-w_{IF})t)] \quad \text{[Equation 2]}$$

Equation 1 represents the operations of the mixer 102, and Equation 2 represents the operations of the mixer 106.

The operator 108 performs the addition operation with respect to the signals received from the mixers 102 and 106. The following Equation 3 represents operations of the operator 108.

$$\frac{1}{2}[\cos((w_{LO}+w_{IF})t) + \cos((w_{LO}-w_{IF})t)] + \quad \text{[Equation 3]}$$
$$\frac{1}{2}[-\cos((w_{LO}+w_{IF})t) + \cos((w_{LO}-w_{IF})t)] =$$
$$\cos((w_{LO}-w_{IF})t)$$

In Equation 3, the operator 108 generates the LSB signal.

Let the IF signal input to the mixer 102 be $\sin(w_{IF}t)$ and let the LO signal be $\cos(w_{LO}t)$. The mixer 102 outputs $\sin(w_{IF}t)\cos(w_{LO}t)$ by mixing the received signals based on Equation 4. Let the IF signal input to the mixer 106 be $\cos(w_{IF}t)$ and let the LO signal be $\sin(w_{LO}t)$. The mixer 106 outputs $\cos(w_{IF}t)\sin(w_{LO}t)$ by mixing the received signals based on Equation 5.

$$\cos(w_{LO}t)\sin(w_{IF}t) = \frac{1}{2}[\sin((w_{LO}+w_{IF})t) - \sin((w_{LO}-w_{IF})t)] \quad \text{[Equation 4]}$$

$$\sin(w_{LO}t)\cos(w_{IF}t) = \frac{1}{2}[\sin((w_{LO}+w_{IF})t) + \sin((w_{LO}-w_{IF})t)] \quad \text{[Equation 5]}$$

Equation 4 represents the operations of the mixer 102, and Equation 5 represents the operations of the mixer 106.

The operator 108 performs the addition operation with respect to the signal received from the mixers 102 and 106.

The following Equation 6 represents the operations of the operator 108.

$$\frac{1}{2}[\sin((w_{LO}+w_{IF})t) - \sin((w_{LO}-w_{IF})t)] +$$

$$\frac{1}{2}[\sin((w_{LO}+w_{IF})t) + \sin((w_{LO}-w_{IF})t)] =$$

$$\sin((w_{LO}+w_{IF})t)$$

[Equation 6]

In Equation 6, the operator 108 generates the USB signal.

The wide-band communication system uses a plurality of carriers to increase the data transmission amount FIG. 2 illustrates a frequency generator in the communication system which transmits data using the plurality of carriers.

Referring to FIG. 2, one LO signal and a plurality of the IF signals are combined to generate the desired number of carriers. The number of the IF signals is n-ary.

The LO signal generated by the LO is provided to the SSB generator 202. The switch 200 receives the n-ary IF signals, selects one of the n-ary IF signals, and provides the selected signal to the SSB generator 202. The SSB generator 202 performs the same operations as in FIG. 1, to thus output a single signal.

As shown in FIG. 2, the signal provided to the SSB generator 202 is not preset, but is selected from the n-ary signals. The SSB generator 202 performs the phase shift on the received signals by a certain unit. Referring back to FIG. 1, the SSB generator 202 shifts the phase of the received signal to 90°. If the number of the received signals is plural, it is hard to perform the phase shift on each signal.

In general, the SSB generator performs accurately the phase shift on one signal. Accordingly, upon receiving other signals, the SSB generator cannot accurately perform the phase shift. If the SSB generator is constructed to shift the phase with respect to $f_1$ alone, it is infeasible to accurately shift the phase with respect to input $f_n$. The inaccurate phase shift results in error components in the signal output from the SSB generator.

SUMMARY OF THE INVENTION

To address the above shortcomings of the conventional arrangement, an exemplary aspect of the present invention is to provide an apparatus and a method capable of performing an accurate phase shift with respect to an entire signal received from a SSB generator.

Another exemplary aspect of the present invention is to provide an apparatus and a method capable of enhancing data transmission by performing an accurate phase shift with respect to an entire signal received from a SSB generator.

To achieve the above aspects and features of the present invention, a method for generating an intermediate frequency (IF) to be transferred to a single sideband (SSB) generator which generates carriers using one local oscillator (LO) signal and at least two IF signals that are received, the method includes generating a group signal including a non-phase-shifted signal and a phase-shifted signal comprising a phase shift of a predetermined value with respect to each IF, and selecting one of at least two group signals and transferring the selected group signal to the SSB generator.

An apparatus for generating an intermediate frequency (IF) to be transferred to a single sideband (SSB) generator which generates carriers using one local oscillator (LO) signal and at least two IF signals that are received, the apparatus includes at least two phase shifters generating a group signal including a non-phase-shifted signal and a phase-shifted signal comprising a phase shift of a predetermined value with respect to each IF, and a multiplexer selecting one of at least two group signals and transferring the selected group signal to the SSB generator.

BRIEF DESCRIPTION OF THE DRAWING FIGURES

These and/or other aspects and advantages of the invention will become apparent and more readily appreciated from the following description of the embodiments, taken in conjunction with the accompanying drawing figures of which:

DETAILED DESCRIPTION OF THE EMBODIMENTS

Figure 1:
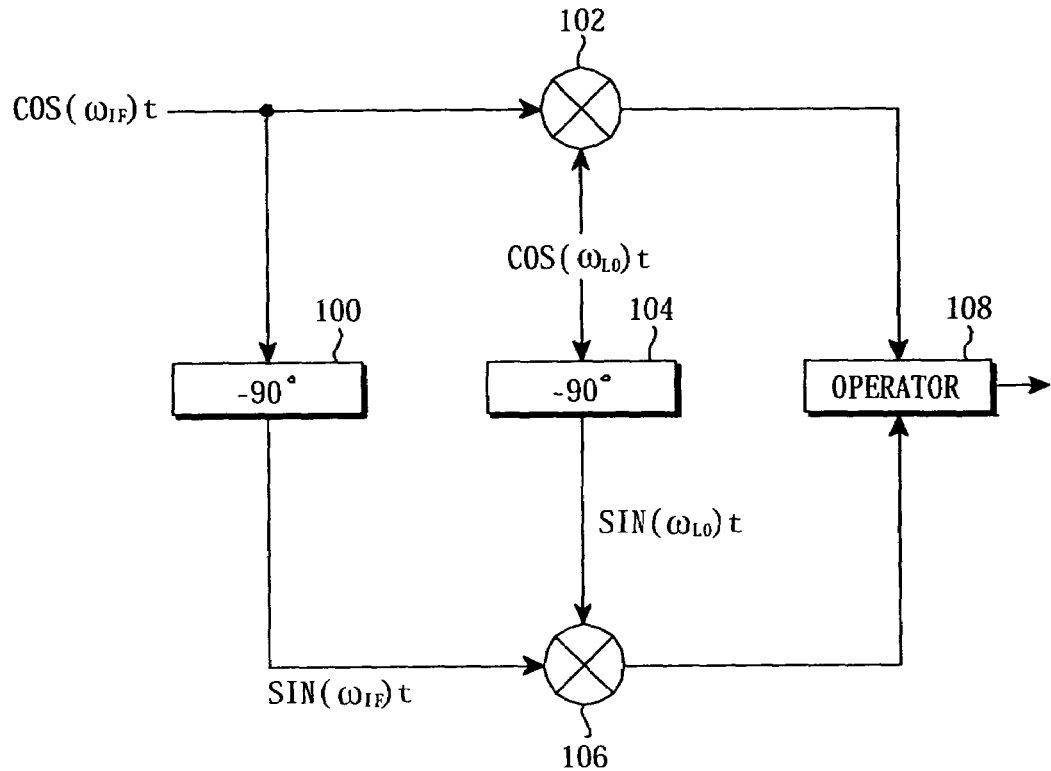
FIG. 1 is a diagram illustrating a conventional SSB modulation.
Figure 2:
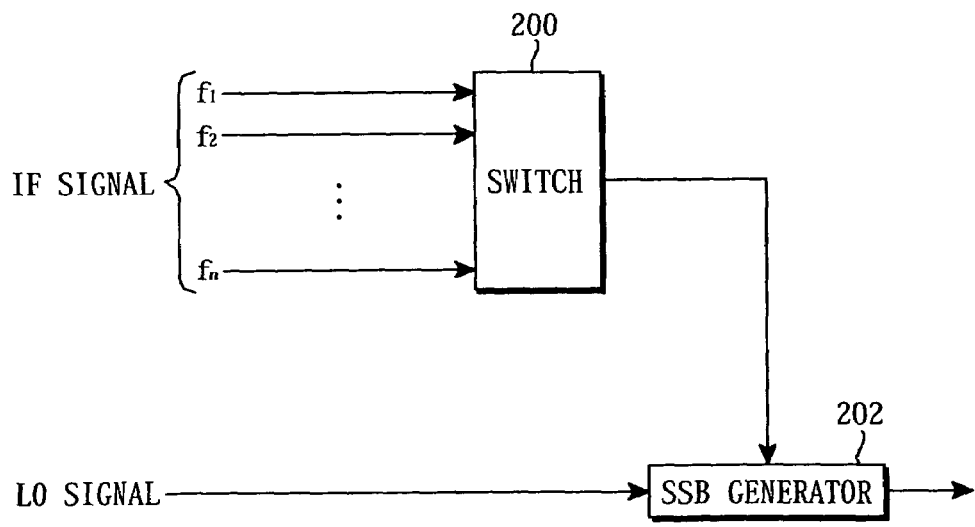
FIG. 2 is a diagram illustrating the generation of the SSB in a mobile communication system using a plurality of carriers.

Reference will now be made in detail to the embodiments of the present invention, examples of which are illustrated in the accompanying drawing figures, wherein like reference numerals refer to the like elements throughout. The embodiments are described below in order to explain the present invention by referring to the drawing figures.

Figure 3:
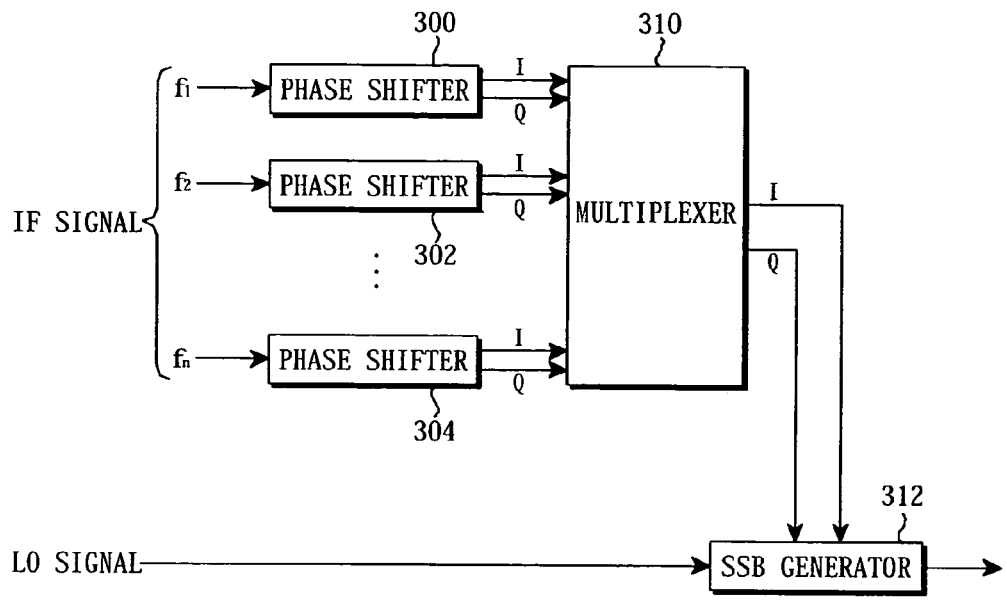
FIG. 3 is a diagram illustrating a mobile communication system using a plurality of carriers according to an embodiment of the present invention.

A method according to an embodiment of the present invention, transfers an intermediate frequency (IF) signal, whose phase is shifted, to a single sideband (SSB) generator, which is described in great detail below. FIG. 3 illustrates a frequency generator which generates a plurality of carriers according to an embodiment of the present invention.

Referring to FIG. 3, the frequency generator includes a plurality of phase shifters 300 to 304, a multiplexer 310, and a SSB generator 312. The phase shifters 300, 302 and 304 simultaneously output a phase-shifted signal and a non-phase-shifted signal. Hereinafter, the signals transferred from each of the phase shifters 300 to 304 are referred to as a group signal. The group signals generated in the phase shifters 300, 302 and 304 are transferred to the multiplexer 310. The multiplexer 310 transfers to the SSB generator 312 desired signals among the received signals. The signals transferred from the multiplexer 310 are a phase-shifted signal and a non-phase-shifted signal with respect to one signal. A switch, as the multiplexer 310, may be utilized to select the signal to be transferred to the SSB generator 312. The SSB generator 312 generates a single signal using the signals received from the multiplexer 310 and a local oscillator (LO) signal, and outputs the generated signal. The SSB generator 312 performs the phase shift only on the LO signal and not on the signals transferred form the multiplexer 310, thus enhancing the efficiency of the SSB generator 312.

By way of example, it is assumed that signals (carriers) to be generated in the SSB generator 312 are at frequencies of about 3432 MHz, 3960 MHz, 4488 MHz, 6336 MHz, 6864 MHz, 7392 MHz, and 7920 MHz. To generate these signals, one LO signal and a plurality of the IF signals are generated. According to an embodiment of the present invention, the LO signal is at a frequency of about 5676 MHz, and the IF signals are combinations of frequencies of about 528 MHz and 660 MHz. The SSB generator 312 can generate signals using the LO signal and the IF signals as shown in Table 1.

TABLE 1

| LO signal | IF signal (660 MHz) | IF signal (528 MHz) | output signals of the SSB generator |
|---|---|---|---|
| 5676 MHz | 660 MHz | 3 × 528 MHz | 7920 MHz |
| | 660 MHz | 2 × 528 MHz | 7392 MHz |
| | 660 MHz | 528 MHz | 6864 MHz |
| | 660 MHz | 0 | 6336 MHz |
| | −660 MHz | 0 | |
| | −660 MHz | −528 MHz | 4488 MHz |
| | −660 MHz | −2 × 528 MHz | 3960 MHz |
| | −660 MHz | −3 × 528 MHz | 3432 MHz |

Figure 4:
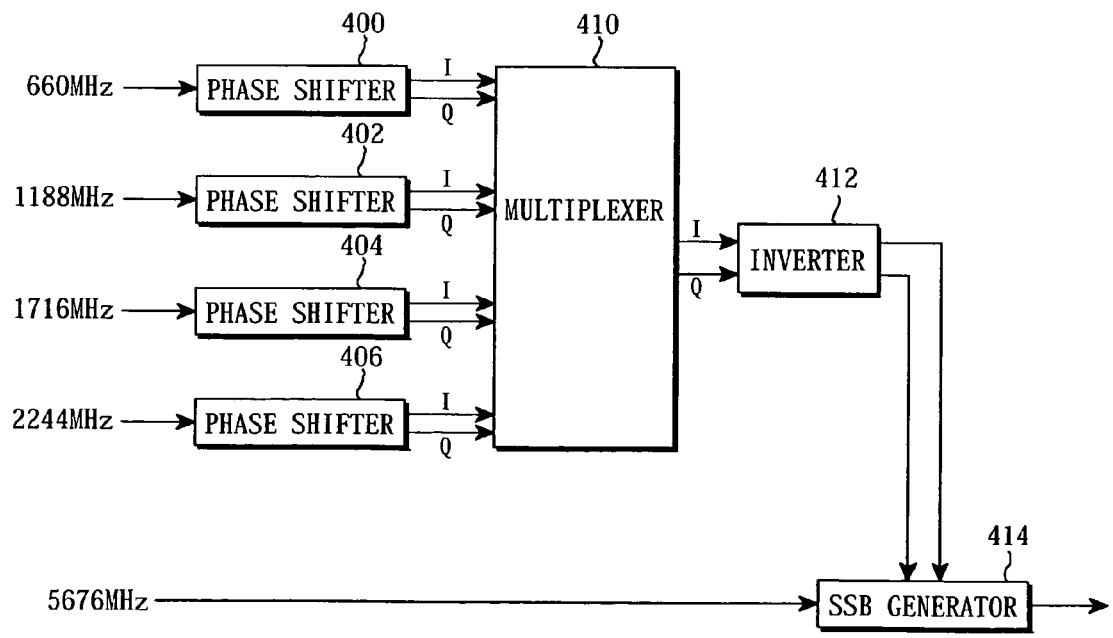
FIG. 4 is a diagram illustrating the mobile communication system using the plurality of carriers according to another embodiment of the present invention.

FIG. 4 illustrates the frequency generator using the plurality of carriers according to another embodiment of the present invention. Referring to FIG. 4, signals transferred to the phase shifters 400, 402, 404 and 406 are frequencies of about 660 MHz, 1188 MHz, 1716 MHz and 2244 MHz, respectively. These signals can be generated by combining the frequency signals of about 660 MHz and 528 MHz of Table 1. That is, the frequency signal of about 1188 MHz is generated by combining frequency signals of about 660 MHz and 528 MHz, and the frequency signal of about 2244 MHz is generated by combining frequency signals of about 660 MHz and 3×528 MHz.

Each phase shifter 400, 402, 404 and 406 generates a phase-shifted signal and a non-phase-shifted signal with respect to the received signal, and transfers the generated signals to the multiplexer 410. The multiplexer 410 selects desired signals among the received signals and transfers the selected signals to an inverter 412. The signals selected by the multiplexer 410 are a phase-shifted signal and a non-phase-shifted signal with respect to one signal.

The inverter 412 determines whether to invert the received signals. If so, the inverter 412 inverts the received signals and transfers the inverted signals to the SSB generator 414. If not, the inverter 412 transfers the received signals to the SSB generator 414. Since the signals are passed through the multiplexer 410 and the inverter 412, the number of the signals to be input to the SSB generator 414 is eight. One signal includes the phase-shifted signal and the non-phase-shifted signal.

The signals to be input to the SSB generator 414 are at frequencies of about −660 MHz, −1188 MHz, −1716 MHz, −2244 MHz, 660 MHz, 1188 MHz, 1716 MHz, and 2244 MHz. The SSB generator 414 generates and outputs a single signal using a frequency of about 5676 MHz and the signals received from the inverter 412. As mentioned above, the SSB generator 414 performs the phase shift only on the signal at a frequency of about 5676 MHz and not on the signals received from the inverter 412.

Figure 5:
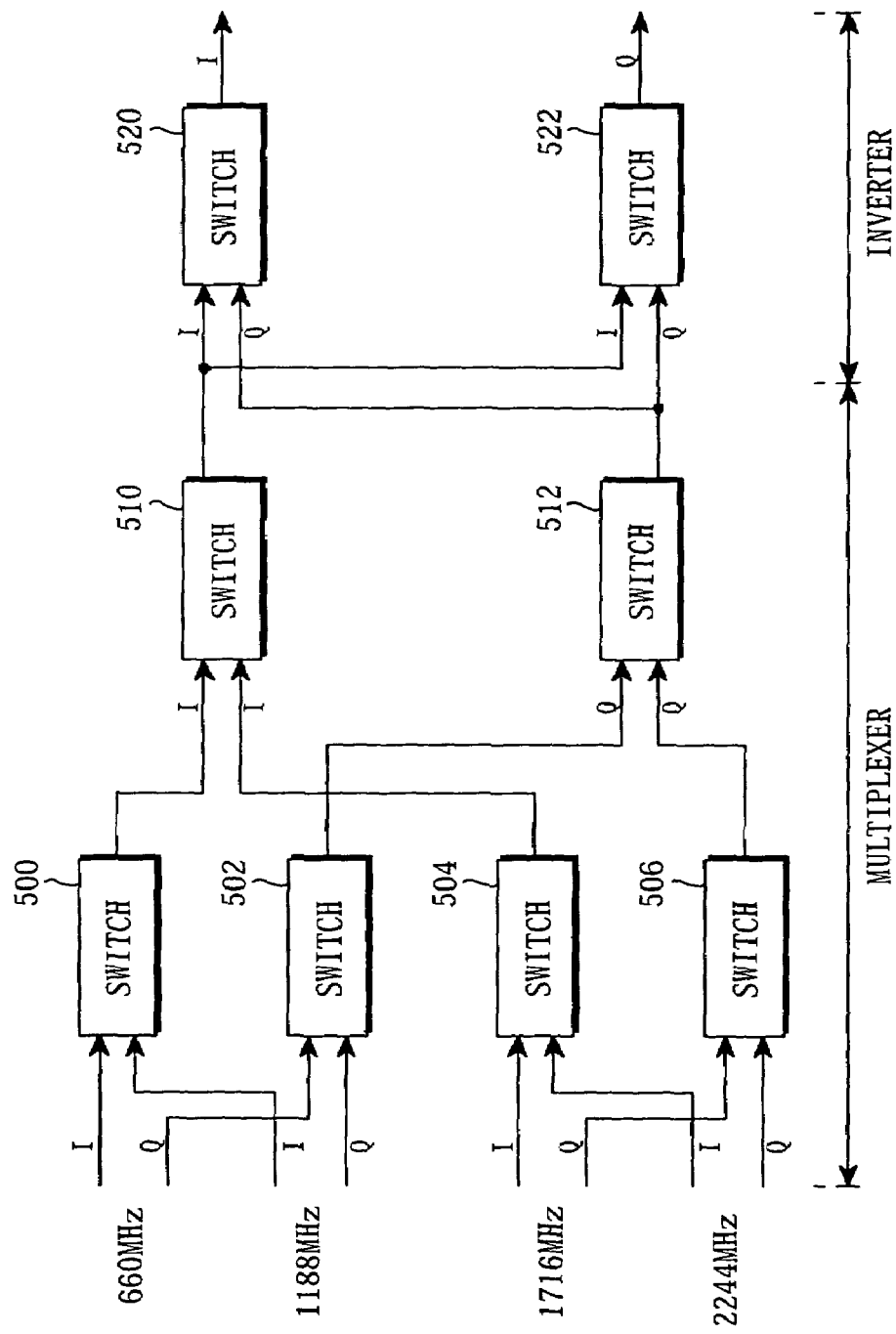
FIG. 5 is a diagram illustrating the multiplexer and the inverter according to an embodiment of the present invention.

FIG. 5 illustrates structures of the multiplexer 410 and the inverter 412, which are described in detail below.

Let the phase-shifted signal be an I signal and the non-phase-shifted signal be a Q signal. The I signal of about 660 MHz output from the phase shifter 400 is transferred to the switch 500, and the Q signal of about 660 MHz is transferred to the switch 502. The I signal of about 1188 MHz output from the phase shifter 402 is transferred to the switch 500, and the Q signal of about 1188 MHz is transferred to the switch 502. The I signal of about 1716 MHz output from the phase shifter 404 is transferred to the switch 504, and the Q signal of about 1716 MHz is transferred to the switch 506. The I signal of about 2244 MHz output from the phase shifter 406 is transferred to the switch 504, and the Q signal of about 2244 MHz is transferred to the switch 506.

The switches 500 to 506 select signals to be transferred to the SSB generator 414 and transfer the selected signals to the switches 510 and 512. Specifically, one signal is selected from the two signals inputted into the switch 500, the other signal is selected from the two signals inputted into the switch 504, and the two selected signals are transferred to the switch 510. One signal is selected from the two signals inputted into the switch 502, the other signal is selected from the two signals inputted into the switch 506, and the two selected signals are transferred to the switch 512. In general, the switch 510 receives only one signal to be transferred to the SSB generator 414 at a certain time, but may receive two signals including the signal to be transferred. The switch 512 receives the signals having the same frequencies as the signals which are transferred to the switch 510.

The switch 510 outputs a signal to be transferred to the SSB generator 414 among the received signals. The switch 512 also outputs a signal to be transferred to the SSB generator 414 among the received signals. The output signal of the switch 510 is transferred to the switch 520 or the switch 522, and that of the switch 512 is transferred to the switch 520 or the switch 522.

The switch 520 or the switch 522 determines whether to invert the received signal. If not, the switch 520 outputs the I signal among the received signals, and the switch 522 outputs the Q signal among the received signals. If the received signals are inverted, the switch 520 outputs the Q signal among the received signal, and the switch 522 outputs the I signal among the received signals.

The output signals of the switches 520 and 522 are transferred to the SSB generator 414. The output signal of the switch 520 is mixed with the I signal of about 5676 MHz in the SSB generator 414, and that of the switch 522 is mixed with the Q signal of about 5676 MHz in the SSB generator 414.

Figure 6:
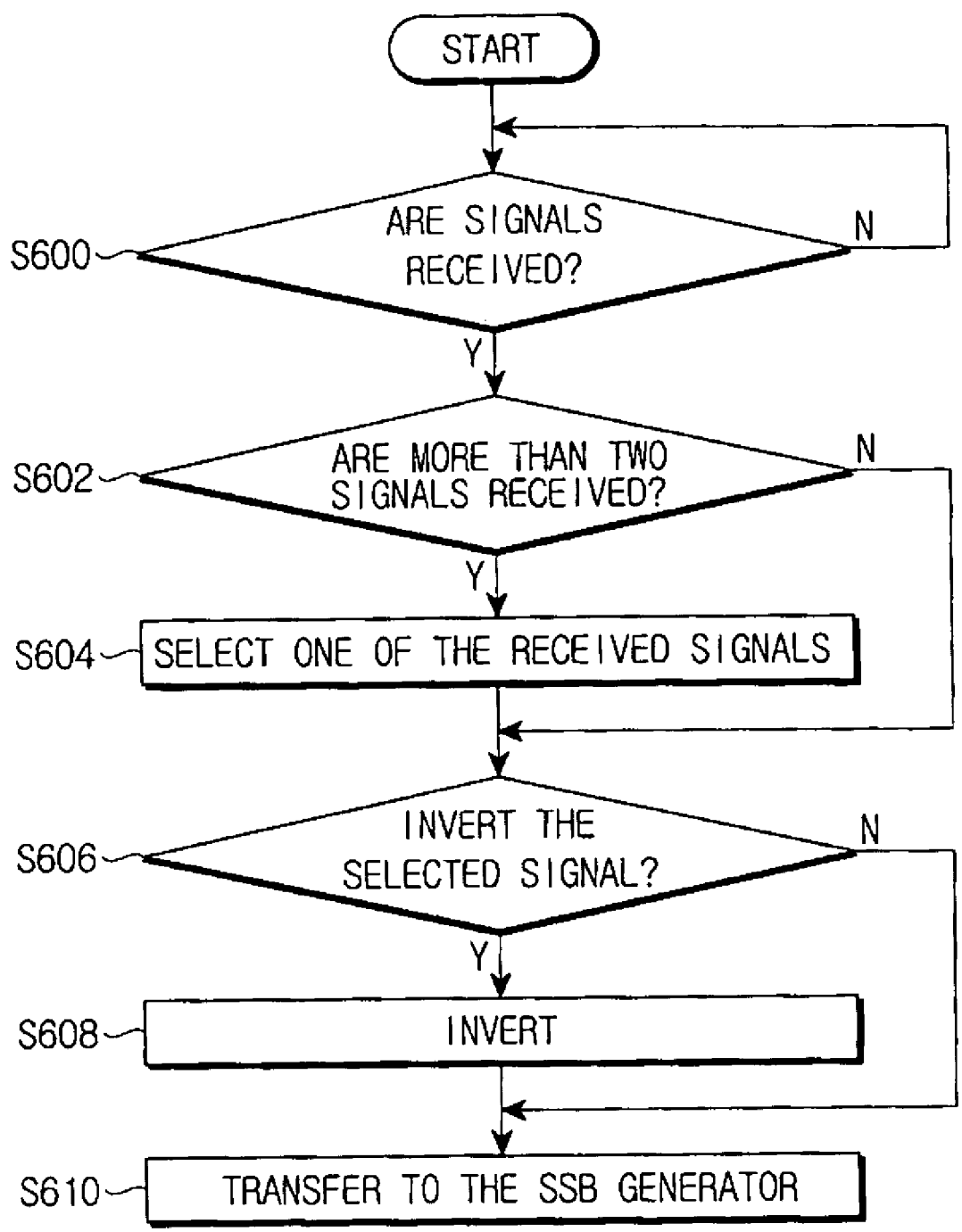
FIG. 6 is a flowchart illustrating exemplary operations of the multiplexer and the inverter according to an embodiment of the present invention.

FIG. 6 illustrates exemplary operations of the multiplexer and the inverter according to an embodiment of the present invention, which are described in detail below.

The multiplexer determines whether the signals are received at step S600. If not, the multiplexer performs the step S600. If so, the multiplexer determines whether the number of the received signals is equal to or more than two at step S602. If more than two signals are received, the multiplexer selects one of the received signals at step S604. If not, that is, if one signal is received, the inverter determines whether to invert the received signal at step S606.

If so, the inverter inverts the selected signal at step S608 and transfers the inverted signal to the SSB generator at step S610. If not, the inverter transfers the non-inverted signal to the SSB generator. Accordingly, the phase-shifted signal and the non-phase-shifted signal are generated from the single signal.

In the light of the foregoing, the phase-shifted signal is transferred to the SSB generator according to an embodiment of the present invention. Thus, it is feasible to implement the SSB generator which is available in the wide band by combining the narrow-band devices. In addition, the phase shifting is efficiently performed without having to use the phase shifter for the wide band signals.

While the embodiments of the present invention have been described, additional variations and modifications of the embodiments may occur to those skilled in the art once they learn of the basic inventive concepts. Therefore, it is intended that the appended claims shall be construed to include both the above embodiments and all such variations and modifications that fall within the spirit and scope of the invention.

What is claimed is:

1. A method for generating an intermediate frequency (IF) to be transferred to a single sideband (SSB) generator which generates carriers using one local oscillator (LO) signal and at least two IF signals, wherein the one LO signal and the at least two IF signals are received, the method comprising:
    generating a group signal including a non-phase-shifted signal and a phase-shifted signal comprising a phase shift of a predetermined value with respect to each IF; and
    selecting one of at least two group signals as a selected group signal and transferring the selected group signal to the SSB generator.

2. The method of claim 1, wherein the one received LO signal comprises a frequency of about 5676 MHz.

3. The method of claim 1, wherein each of the at least two IF signals are at a frequency of about 660 MHz, 1188 MHz, 1716 MHz, or 2244 MHz.

4. The method of claim 3, wherein the frequencies of about 1188 MHz, 1716 MHz, and 2244 MHz are generated by combining frequencies of about 660 MHz and of about 528 MHz or a multiple of the frequency of about 528 MHz.

5. The method of claim 1, wherein each of the carriers generated in the SSB generator are at a frequency of about 3432 MHz, 3960 MHz, 4488 MHz, 6336 MHz, 6864 MHz, 7392 MHz, or 7920 MHz.

6. The method of claim 5, wherein group signals corresponding to frequencies of about 1188 MHz, 1716 MHz, and 2244 MHz are inverted to generate the carriers of about 3432 MHz, 3960 MHz, and 4488 MHz, as inverted group signals, and the inverted group signals are transferred to the SSB generator.

7. The method of claim 1, wherein the predetermined value of the phase shift is about 90°.

8. An apparatus for generating an intermediate frequency (IF) to be transferred to a single sideband (SSB) generator which generates carriers using one local oscillator (LO) signal and at least two IF signals, wherein the one LO signal and the at least two IF signals are received, the apparatus comprising:
    at least two phase shifters generating a group signal including a non-phase-shifted signal and a phase-shifted signal comprising a phase shift of a predetermined value with respect to each IF; and
    a multiplexer selecting one of at least two group signals as a selected group signal and transferring the selected group signal to the SSB generator.

9. The apparatus of claim 8, wherein the SSB generator receives the one LO signal comprising a frequency of about 5676 MHz.

10. The apparatus of claim 9, wherein the SSB generator generates a non-phase-shifted signal of the one LO signal and a phase-shifted signal of the one LO signal comprising a phase shift of a predetermined degree.

11. The apparatus of claim 9, wherein the at least two phase shifters receive one of the at least two IF signals having frequencies of about 660 MHz, 1188 MHz, 1716 MHz, or 2244 MHz.

12. The apparatus of claim 11, wherein the frequencies of about 1188 MHz, 1716 MHz, and 2244 MHz are generated by combining frequencies of about 660 MHz and of about 528 MHz or a multiple of the frequency of about 528 MHz.

13. The apparatus of claim 8, wherein the SSB generator generates the carriers having frequencies of about 3432 MHz, 3960 MHz, 4488 MHz, 6336 MHz, 7392 MHz, or 7920 MHz.

14. The apparatus of claim 13, further comprising an inverter inverting group signals corresponding to frequencies of about 1188 MHz, 1716 MHz, and 2244 MHz to generate the carriers comprising the frequencies of about 3432 MHz, 3960 MHz, or 4488 MHz, to generate inverted group signals, and the inverter transferring the inverted group signals to the SSB generator.

* * * * *